(12) United States Patent
Pitney et al.

(10) Patent No.: US 8,940,094 B2
(45) Date of Patent: Jan. 27, 2015

(54) METHODS FOR FABRICATING A SEMICONDUCTOR WAFER PROCESSING DEVICE

(75) Inventors: John Allen Pitney, St. Peters, MO (US); Manabu Hamano, Utsunomiya (JP)

(73) Assignee: SunEdison Semiconductor Limited, Singapore (SG)

( * ) Notice: Subject to any disclaimer, the term of this patent is extended or adjusted under 35 U.S.C. 154(b) by 197 days.

(21) Appl. No.: 13/443,076

(22) Filed: Apr. 10, 2012

(65) Prior Publication Data
US 2013/0263776 A1    Oct. 10, 2013

(51) Int. Cl.
*C30B 21/02* (2006.01)

(52) U.S. Cl.
USPC ............ 117/98; 117/86; 117/101; 117/104

(58) Field of Classification Search
USPC .................... 117/86, 104, 101, 98
See application file for complete search history.

(56) References Cited

U.S. PATENT DOCUMENTS

| | | |
|---|---|---|
| 6,444,027 B1 | 9/2002 | Yang et al. |
| 7,270,708 B2 | 9/2007 | Yoshida et al. |
| 8,021,484 B2 | 9/2011 | Narahara et al. |
| 2005/0000449 A1 | 1/2005 | Ishibashi et al. |
| 2005/0016466 A1* | 1/2005 | Scudder et al. ............ 118/728 |
| 2007/0227441 A1 | 10/2007 | Narahara et al. |

FOREIGN PATENT DOCUMENTS

| | | |
|---|---|---|
| EP | 0619381 A1 | 10/1994 |
| WO | 03060967 A1 | 7/2003 |

OTHER PUBLICATIONS

PCT International Search Report and Written Opinion of the International Search Authority mailed on May 31, 2013 regarding PCT/US2013/035777 filed on Apr. 9, 2013, 10 pgs.

* cited by examiner

*Primary Examiner* — Bob M Kunemund
(74) *Attorney, Agent, or Firm* — Armstrong Teasdale LLP

(57) ABSTRACT

A method of fabricating a semiconductor processing device includes providing a susceptor including a substantially cylindrical body portion having opposing upper and lower surfaces. The body portion has a diameter larger than a wafer diameter. The method also includes providing a set of holes circumferentially disposed at a first susceptor diameter, the set of holes being evenly spaced with respect to adjacent holes and extending through the upper and lower surfaces in an area. The first susceptor diameter is larger than the wafer diameter, and holes are omitted along the first diameter in a set of predetermined orientations.

10 Claims, 5 Drawing Sheets

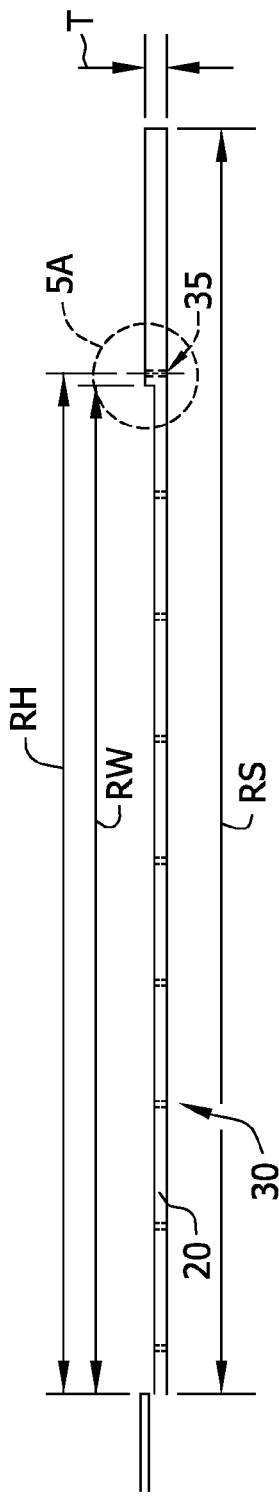
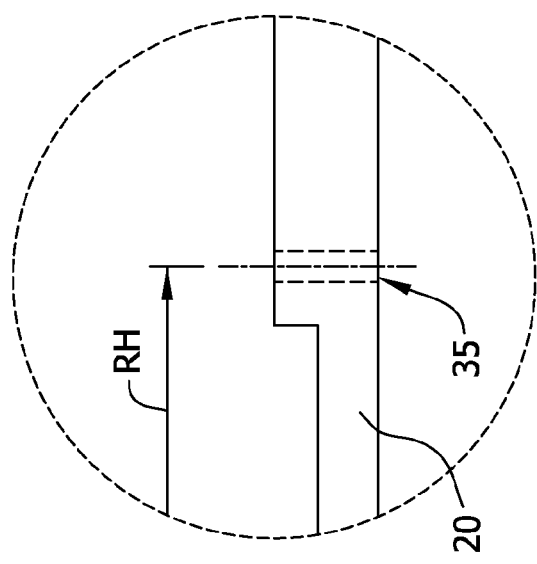
FIG. 5
FIG. 5A

METHODS FOR FABRICATING A SEMICONDUCTOR WAFER PROCESSING DEVICE

FIELD

The field of the disclosure generally relates to semiconductor wafer processing, and more particularly to susceptors and related methods for epitaxial processing.

BACKGROUND

Epitaxial chemical vapor deposition is a process for growing a thin layer of material on a semiconductor wafer so that the lattice structure is identical to that of the wafer. Using this process, a layer having different conductivity type, dopant species, or dopant concentration may be applied to the semiconductor wafer to achieve the necessary electrical properties. Epitaxial chemical vapor deposition is widely used in semiconductor wafer production to build up epitaxial layers such that devices can be fabricated directly on the epitaxial layer. For example, a lightly doped epitaxial layer deposited over a heavily doped substrate permits a CMOS device to be optimized for latch up immunity as a result of the low resistivity of the substrate. Other advantages, such as precise control of the dopant concentration profile and freedom from oxygen are also achieved.

Prior to epitaxial deposition, the semiconductor wafer is typically mounted on a susceptor in a deposition chamber. The epitaxial deposition process begins by introducing a cleaning gas, such as hydrogen or a hydrogen and hydrogen chloride mixture, to a front surface of the wafer (i.e., a surface facing away from the susceptor) to pre-heat and clean the front surface of the wafer. The cleaning gas removes native oxide from the front surface, permitting the epitaxial silicon layer to grow continuously and evenly on the surface during a subsequent step of the deposition process. The epitaxial deposition process continues by introducing a vaporous silicon source gas, such as silane or a chlorinated silane, to the front surface of the wafer to deposit and grow an epitaxial layer of silicon on the front surface. A back surface opposite the front surface of the susceptor may be simultaneously subjected to hydrogen gas. The susceptor, which supports the semiconductor wafer in the deposition chamber during the epitaxial deposition, is rotated during the process to ensure the epitaxial layer grows evenly.

Epitaxial delta edge roll-off (DERO) is generally an undesirable effect of epitaxial deposition in that it may negatively affect flatness. DERO varies azimuthally according to the crystal lattice directions in conventional, monocrystalline silicon wafers. Flatness of the wafer may commonly be measured by quantities known as SFQR, SBIR, ROA, ERO, ESFQR, ESFQD and the like. In a conventional (100)-oriented silicon wafer, there are four equidistant points around the circumference of the wafer that correspond to <110> equivalent directions. In conventional wafers, DERO may be largest near certain directions, specifically the <110> directions. On the edge profile, including the edge bevel and a rounded interface between the edge bevel and the lateral surface of the wafer, there are typically exposed surfaces near the (311) orientations. Epitaxial growth on the (311) surfaces of the wafer is hindered by large densities of surface atoms on the (311) planes of the wafer. Accordingly, the gas stream is depleted of silicon precursors to a lesser extent when passing from near the (311) surfaces of the wafer onto the near-edge front and back surfaces of the wafer during processing. The result is enhanced growth rate in the vicinity near the (311) surfaces, which may lead to a large DERO in such areas. Epitaxial DERO on silicon wafers undesirably affects the flatness of the wafer, especially near the edge of the wafer. Thus, there remains a need for a system and method for processing a silicon wafer to reduce variation in DERO.

BRIEF SUMMARY

One aspect is directed to a susceptor for supporting a semiconductor wafer during an epitaxial chemical vapor deposition process. The susceptor defines a wafer diameter. The susceptor includes a substantially cylindrical body portion having opposing upper and lower surfaces, the body portion has a diameter larger than the wafer diameter. A set of holes in the body portion are circumferentially disposed at a first diameter. The set of holes are evenly spaced with respect to adjacent holes and extend through the upper and lower surfaces. The first diameter is larger than the wafer diameter, and there are no holes along the first diameter in a set of predetermined orientations.

Another aspect is directed to a susceptor defining a wafer diameter. The susceptor includes a substantially cylindrical body portion having opposing upper and lower surfaces, the body portion having a diameter larger than the wafer diameter. A set of holes extends through the upper and lower surfaces at a given diameter of the susceptor radially outward of the wafer diameter. A density of the set of holes varies circumferentially around the given diameter.

In still another aspect, a method of fabricating a semiconductor processing device includes providing a susceptor including a substantially cylindrical body portion having opposing upper and lower surfaces, the body portion having a diameter larger than a wafer diameter. The method also includes providing a set of holes circumferentially disposed at a first susceptor diameter, the set of holes being evenly spaced with respect to adjacent holes and extending through the upper and lower surfaces in an area. The first susceptor diameter is larger than the wafer diameter, and holes are omitted along the first diameter in a set of predetermined orientations.

In yet another aspect, a method of treating a wafer in an epitaxial chemical vapor deposition process includes providing a susceptor having a plurality of holes circumferentially disposed at a diameter larger than a diameter of a wafer to be treated. The method also includes placing the untreated wafer on the susceptor in a predetermined orientation such that <110> directions of the wafer aligns with portions of the susceptor that are free of holes outward from the diameter of the untreated wafer and chemically treating the wafer.

BRIEF DESCRIPTION OF THE DRAWINGS

FIG. 5 is a cross section of the susceptor of FIG. 4.

FIG. 5A is a detail view of the susceptor of FIG. 5.

DETAILED DESCRIPTION

Figure 1:
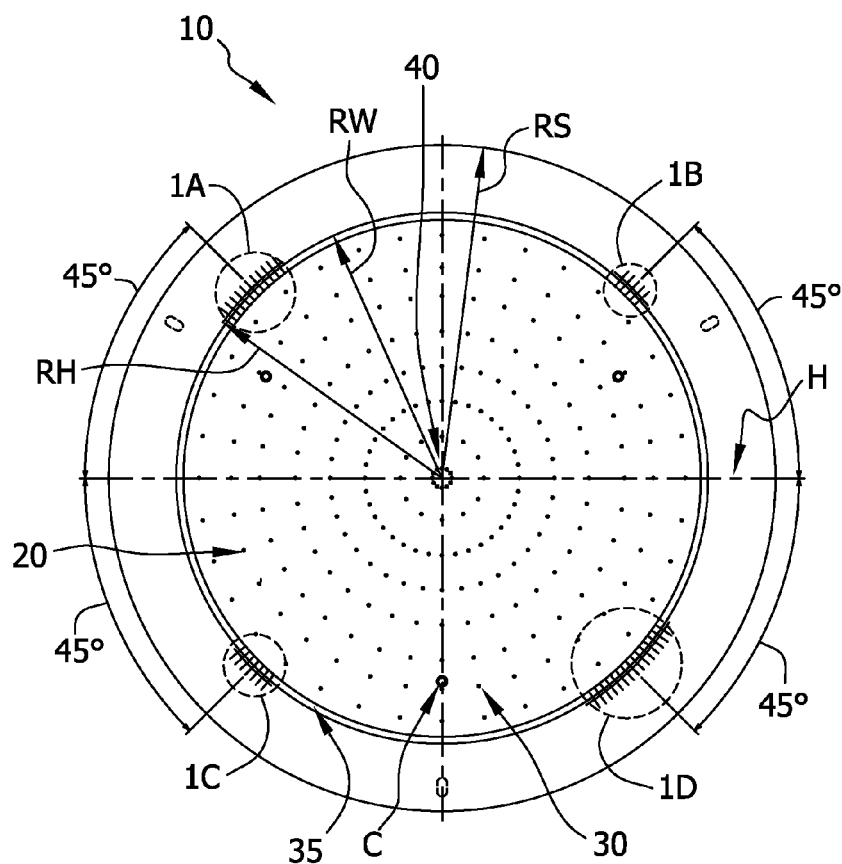
FIG. 1 is a top view of a test susceptor according to an embodiment of the present disclosure.
Figure 1A:
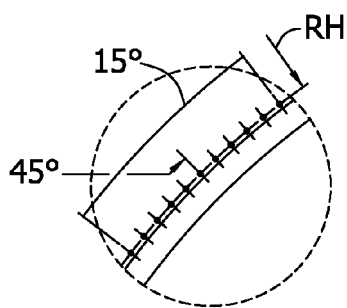
FIGS. 1A-1D are detail views of the susceptor of FIG. 1.
Figure 1B:
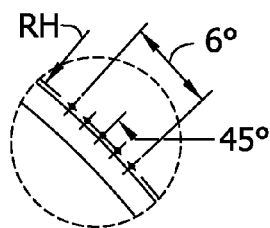
Figure 1C:
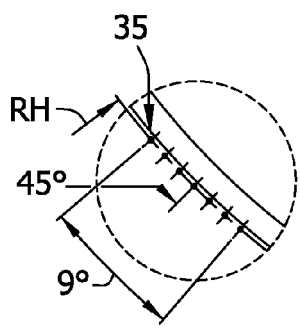
Figure 1D:
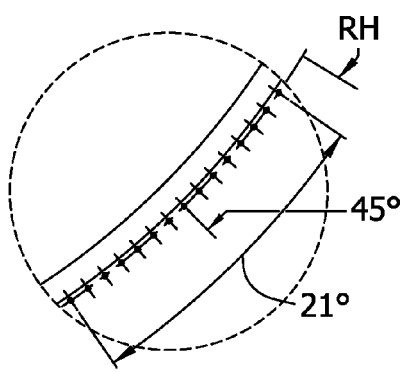

Referring now to the drawings, and in particular to FIG. 1, a test susceptor is generally indicated at 10. Susceptor 10 of this embodiment is substantially circular in shape, though other shapes are contemplated. The susceptor is suitable to support a semiconductor wafer (not shown) in a deposition chamber, such as a chemical vapor deposition (CVD) chamber, during a CVD process. In this embodiment, the semiconductor wafer has a wafer radius RW that is smaller than the susceptor radius RS of susceptor 20. In this embodiment, the wafer radius is approximately 150 millimeters, but may be other radii between about 25 mm and about 300 mm, such as approximately 25.5 mm, 50 mm, 75 mm, 100 mm, 150 mm, 200 mm, 225 mm, 300 mm and the like. However, the wafer radius RW and susceptor radius RS of susceptor 20 may be any radius that allows the susceptor to operate as described herein.

In this embodiment, susceptor 10 has a disk-shaped body 20 with a center 40. Body 20 is substantially planar and includes a set of through-holes 30. Through-holes 30 are arranged in a pattern, such as a grid pattern or the like, and may include a through-hole located at center 40. In this embodiment, each of the through-holes is located at a predetermined distance and angle from center 40. Angle measurements are taken with reference to horizontal line H, with positive angles increasing in a counter-clockwise direction.

Without being bound to a particular theory, a CVD process tends to deposit a small amount of silicon on the back face of the wafer and may thicken the near-edge region of the wafer (within a few millimeters, e.g., within 5-6 mm, within 3-4 mm or within 1-2 mm of the wafer edge) relative to regions that are inward of the edge. Such thickening may increase DERO.

In this embodiment, certain through-holes 35 in the susceptor are disposed at a radial distance RH just outward of the wafer radius, to reduce the azimuthal DERO variation. Holes outside the wafer radius 35 may tend to increase the DERO nearby the holes. In one embodiment, to reduce the variation of DERO by angle, holes 35 are added where the DERO is smallest. For example, points near <110> directions have higher DERO than is typical of other points on the wafer, and points near outside holes have higher DERO than is typical of other points on the wafer. Thus, in this embodiment, holes 35 are added outside of the wafer radius RW at hole radius RH to make the DERO between the <110> directions substantially match the DERO at the <110> directions, thereby reducing the DERO variation. In this embodiment, the total DERO averaged over the whole wafer edge is increased compared to a wafer made on a susceptor without the added holes outside the wafer radius 35. Having a reduced variation of DERO around the wafer edge enables better matching of epi DERO with the incoming wafer ERO, resulting in good flatness. By including the holes just outside the wafer radius 35, except near the <110> directions, the azimuthal DERO variation is reduced.

In order to test the effect of changing the angular position of the holes 35, a different number of holes were added at locations 1A, 1B, 1C and 1D shown on FIG. 1, at an outside hole radius RH. When referring to angle measurements herein, the convention of 0 degrees being on the right side of the horizontal axis H and angles increase going counterclockwise is used.

In the embodiment of FIG. 1, susceptor 20 has DERO holes 35 (added outside the wafer radius) disposed at 150.6 mm, and at approximately 90 degree intervals aligned with the <100> directions of a <110> notched wafer with its notch located at reference C (i.e., 270 degrees). The holes 35 are added to increase the DERO locally to the holes. At the <110> locations the DERO is the largest. Detail views of each location 1A-1D are shown in FIG. 1 as FIG. 1A, FIG. 1B, FIG. 1C and FIG. 1D. At location 1B, corresponding to an angle of 45 degrees, measured according to the angle convention used by the KLA-Tencor WaferSight (WS) tool, five holes were added over a 6 degree span. Each of the holes has a diameter of 0.9 mm, with a variance of plus-or-minus 0.05 mm. At location 1A, corresponding to an angle of 135 degrees, eleven holes were added over a span of 15 degrees. Each of the holes has a diameter of 0.9 mm, with a variance of plus-or-minus 0.05 mm. At location 1C, corresponding to an angle of 225 degrees, seven holes were added over a span of 9 degrees. Each of the holes has a diameter of 0.9 mm, with a variance of plus-or-minus 0.05 mm. At location 1D, corresponding to an angle of 315 degrees, fifteen holes were added over a span of 21 degrees. Each of the holes in this embodiment has a diameter of 0.9 mm, with a variance of plus-or-minus 0.05 mm.

Figure 2:
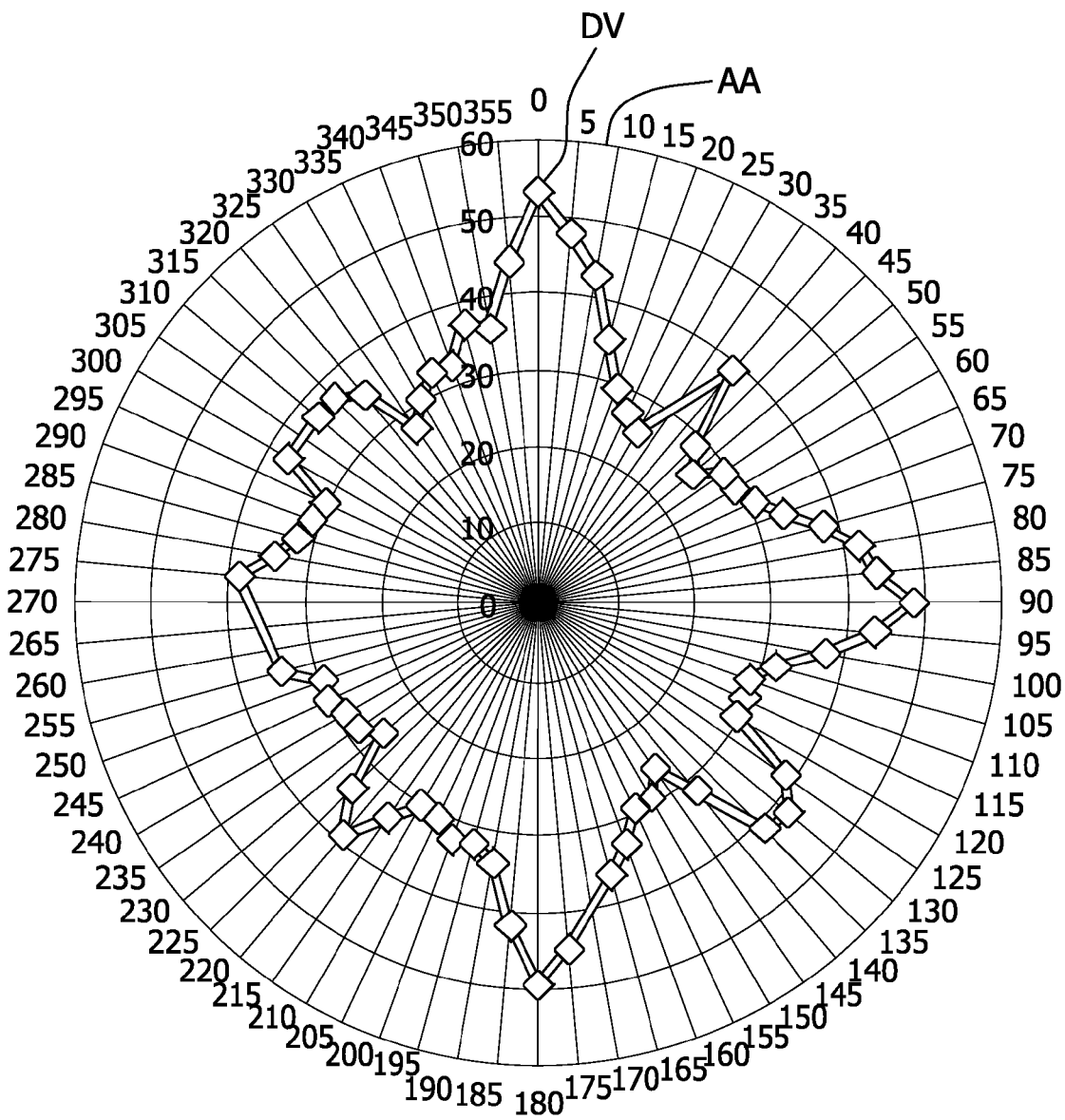
FIG. 2 is a plot of azimuthal variation in DERO of a wafer processed on the susceptor of FIG. 1.

FIG. 2 shows a plot of the DERO values DV as a function of azimuthal angle AA from a wafer processed on the FIG. 1 test susceptor having the above described holes added at locations 1A-1D. Angles shown in FIG. 2 correspond to the angles measured by the WS tool. In FIG. 2, DERO values DV are measured in nanometers. The peaks in DERO values DV at 40 degrees, 130 degrees, 220 degrees and 310 degrees may be a result of the holes 35 added outside the wafer radius at locations 1A-1D. Such peaks are absent for wafers processed on conventional susceptors. The peaks in DERO values DV located at 0 degrees, 90 degrees, 180 degrees, and 270 degrees result from the <110> effect. The DERO values DV are measured at a 148 mm wafer radius. Such results may suggest that DERO increases by approximately 15 nm with holes spaced approximately 1.5 degrees apart. Accordingly, to make the DERO away from the <110> positions of the wafer substantially match the DERO at the <110> positions, a response coefficient of 22.5 nm·degrees is applied to calculate a hole density for angles between the <110> directions. The results of the calculations are shown in Table 1:

| Angle | Hole Density (deg −1) | Hole Spacing (deg) |
|---|---|---|
| 0 | 0 | no holes |
| 5 | 0.26 | 3.83 |
| 10 | 0.38 | 2.63 |
| 15 | 0.63 | 1.60 |
| 20 | 0.72 | 1.40 |
| 25 | 0.83 | 1.20 |
| 30 | 0.86 | 1.17 |
| 35 | 0.91 | 1.10 |
| 40 | 0.93 | 1.07 |
| 45 | 0.95 | 1.06 |

Figure 3:
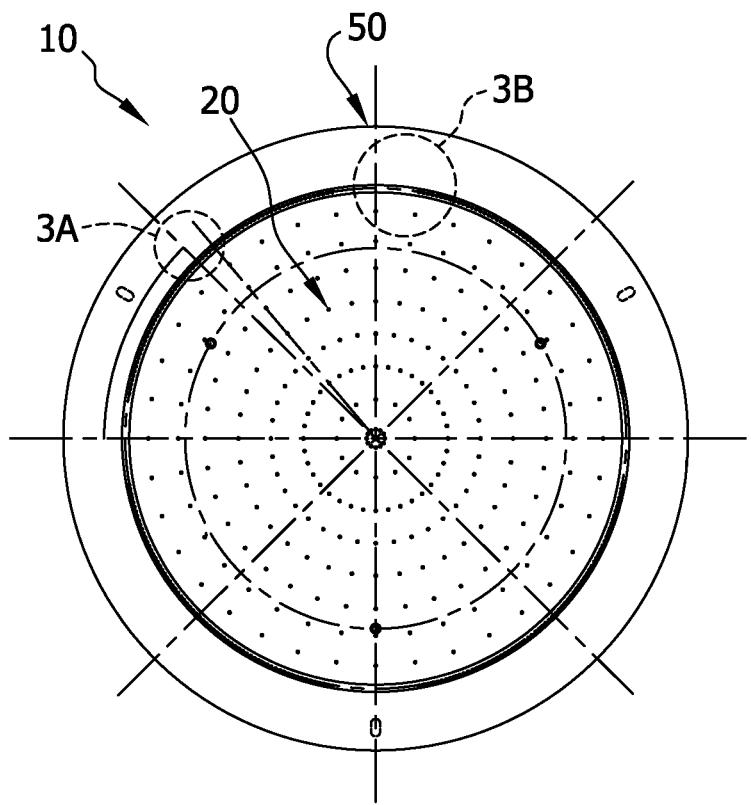
FIG. 3 is a top view of an embodiment of a susceptor according to the present disclosure.
Figure 3A:
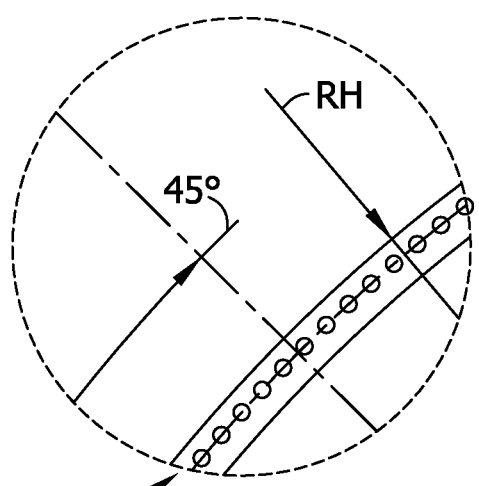
FIGS. 3A and 3B are detail views of the susceptor of FIG. 3.
Figure 3B:
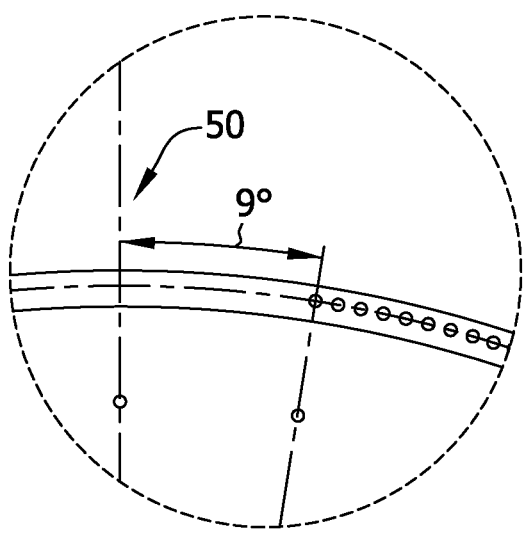

FIG. 3 shows another exemplary embodiment of a susceptor 20 having the Table 1 hole spacing. In this embodiment, for a wafer radius RW of 150 mm, holes 35 are disposed at a radius RH of approximately 150.6 mm. In this embodiment, the holes 35 outside the wafer radius are omitted at locations of approximately plus-or-minus 9 degrees of the <110> directions of the wafer. Holes 35 have a diameter of approximately 0.9 mm, but other diameters and radii may be used. FIG. 3A shows a detail view of area 3A of susceptor 10. FIG. 3B shows a detail view of area 3B of susceptor 10.

Figure 4:
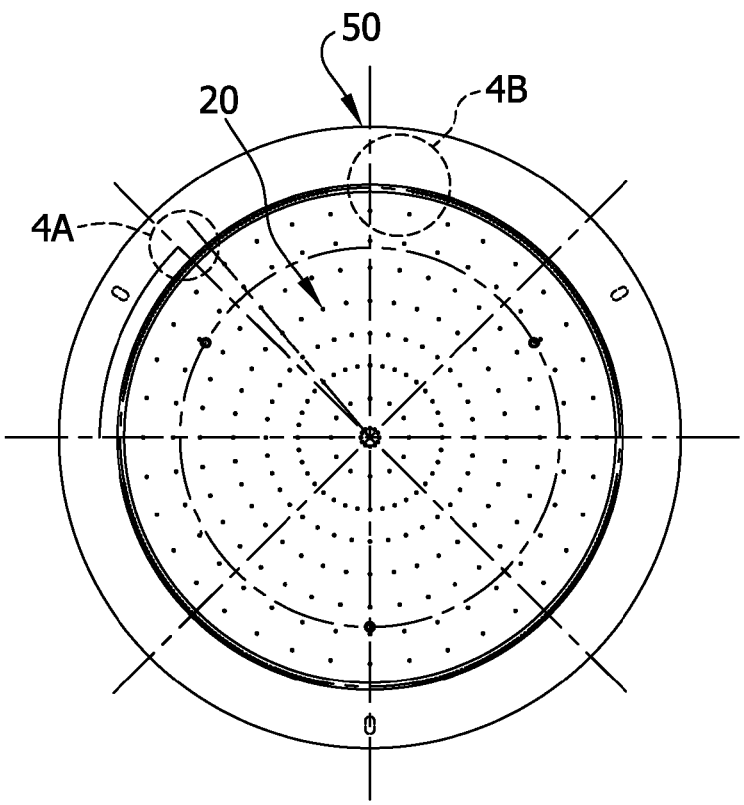
FIG. 4 is a top view of another embodiment of a susceptor.
Figure 4A:
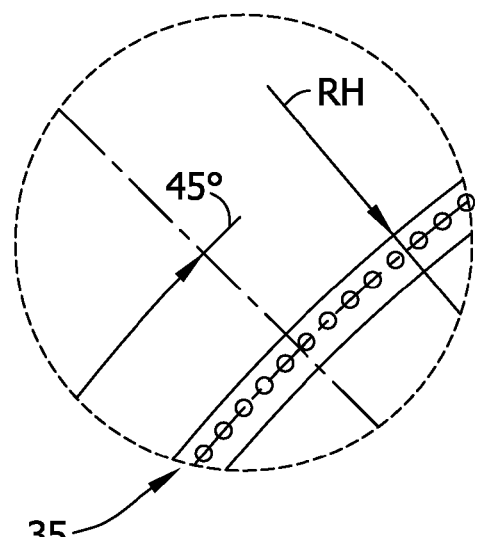
FIGS. 4A and 4B are detail views of the susceptor of FIG. 4.
Figure 4B:
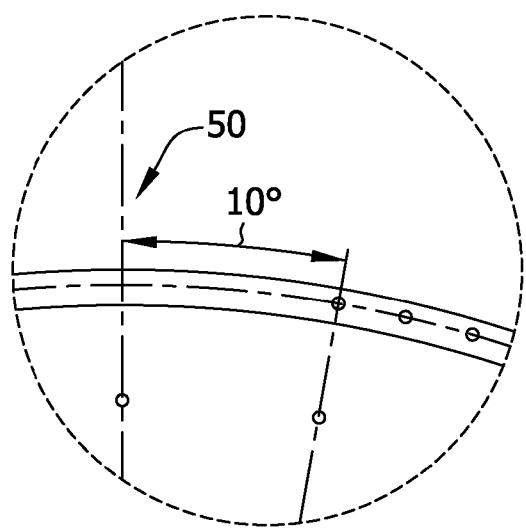

In the embodiment of FIG. 4, for a wafer radius of 150 mm, holes 35 are disposed at a radius RH of approximately 150.6 mm. In this embodiment, the holes outside the wafer radius 35 are omitted at orientation locations of approximately plus-or-minus 10 degrees of the <110> directions of the wafer. In contrast, in the FIG. 1 test susceptor, the angular range over which the holes are omitted is different for each of the four <110> directions. In this embodiment, as shown in Detail 4A (FIG. 4A), the holes are located at angular positions of 45.0, 43.9, 42.8, 41.7, 40.6, 39.5, 38.4, 37.3, 36.2, 35.1, 34.0, 32.9, 31.8, 30.7, 29.6, 28.4, 27.2, 26.0, 24.8, 23.6, 22.4, 21.1, 19.8, 18.4, 17.0, 15.5, 14.0, 12.3 and 10 degrees. The hole pattern may be reflected (i.e. symmetrical) about a 45 degree line and repeated up to four times (i.e., may be identical in each quadrant). Detail 4B (FIG. 4B) shows that holes are omitted within 10 degrees of <110> location 50.

In an epitaxial CVD reactor of one embodiment, there are two process chambers referred to as Chamber A and Chamber B. In one mode of operation, wafers processed in Chamber A are rotated such that the wafer notch is 7 degrees counter-clockwise of the reference C position. Wafers processed in Chamber B have the wafer notch rotated 7 degrees clockwise of the reference C position. In one embodiment, to accommodate the difference in alignment between the wafers and susceptors, wafers are prealigned in a cassette with the notch in a direction corresponding to the chamber in which it is to be processed (i.e., Chamber A or Chamber B). In another embodiment, the pattern of through-holes 30 may be rotated, corresponding to Chamber A or Chamber B. In yet another embodiment, the plus or minus 7 degree misalignment between the wafer crystal directions and the pattern of holes added outside the wafer diameter may be neglected.

FIG. 5 shows a cross section of susceptor 10. Susceptor 10 has a thickness T. The holes 35 outside the wafer radius RW extend entirely through thickness T of body 20 of susceptor 10.

In other embodiments, wafers may have a notch located at a direction other than the <110> direction, such as the <100> direction. For wafers with <100> direction notches, the wafer may be loaded on susceptor 20 such that the notch is approximately 45 degrees, 135 degrees, 225 degrees, or 315 degrees to the reference C position, shown in FIG. 3. However, it is contemplated that other wafer notch positions may be used in accordance with the present disclosure.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A method of treating a wafer in an epitaxial chemical vapor deposition process, the method comprising:
   providing a susceptor having a plurality of holes circumferentially disposed at a first susceptor diameter, wherein the first susceptor diameter is larger than a diameter of a wafer to be treated;
   placing the untreated wafer on the susceptor in a predetermined orientation such that <110> directions of the wafer aligns with portions of the susceptor that are free of holes outward from the diameter of the untreated wafer; and
   chemically treating the wafer.

2. The method according to claim 1, wherein the diameter of the wafer is a first diameter, the method further comprising measuring a delta edge roll off at a second diameter of the wafer.

3. The method according to claim 1, wherein placing the untreated wafer on the susceptor comprises placing the wafer on the susceptor such that no holes are outside the wafer diameter at locations of approximately plus-or-minus 9 degrees of the <110> directions of the wafer.

4. The method according to claim 1, wherein placing the untreated wafer on the susceptor comprises placing the wafer on the susceptor such that no holes are outside the wafer diameter at locations of approximately plus-or-minus 10 degrees of the <110> directions of the wafer.

5. The method according to claim 1, wherein providing the susceptor includes providing the plurality of holes in groups, each of the groups being disposed at 90 degree intervals to an adjacent group.

6. The method according to claim 1, wherein providing the susceptor includes providing the plurality of holes with a spacing between each hole of between about 1 degree and about 4 degrees.

7. The method according to claim 1, wherein the wafer diameter is between about 150 mm and about 300 mm.

8. The method according to claim 1, wherein each hole has a diameter of between about 0.8 mm and about 1.0 mm.

9. The method according to claim 1, wherein providing the susceptor comprises providing the plurality of holes at a hole density that varies circumferentially around the first susceptor diameter.

10. The method according to claim 9, wherein the hole density varies from between about 0.25 holes per degree to about 1.0 holes per degree.

* * * * *